United States Patent [19]
Berger et al.

[11] 4,090,255
[45] May 16, 1978

[54] CIRCUIT ARRANGEMENT FOR OPERATING A SEMICONDUCTOR MEMORY SYSTEM

[75] Inventors: Horst H. Berger, Sindelfingen; Klaus Heuber, Boeblingen; Wilfried Klein, Holzgerlingen; Knut Najmann, Gaertringen; Siegfried Wiedmann, Stuttgart, all of Germany

[73] Assignee: International Business Machines Corporation, Armonk, N.Y.

[21] Appl. No.: 662,309

[22] Filed: Mar. 1, 1976

[30] Foreign Application Priority Data

Mar. 15, 1975 Germany .............................. 2511518

[51] Int. Cl.² ......................... G11C 11/40; G11C 7/00
[52] U.S. Cl. .................................... 365/154; 365/175; 365/189
[58] Field of Search .................... 340/173 FF, 173 R; 307/290, 292

[56] References Cited

U.S. PATENT DOCUMENTS

| | | | |
|---|---|---|---|
| 3,067,336 | 12/1962 | Eachus | 340/173 R |
| 3,177,374 | 4/1965 | Simonian et al. | 340/173 R |
| 3,284,782 | 11/1966 | Burns | 340/173 R |
| 3,292,008 | 12/1966 | Rapp | 340/173 R |
| 3,363,115 | 1/1968 | Stephenson et al. | 340/173 R |
| 3,447,137 | 5/1969 | Feuer | 340/173 R |
| 3,518,635 | 6/1970 | Cole et al. | 340/173 R |
| 3,588,848 | 6/1971 | Van Beck | 340/173 R |
| 3,806,898 | 4/1974 | Askin | 340/173 R |
| 4,023,148 | 5/1977 | Hueber et al. | 340/173 R |

*Primary Examiner*—Vincent P. Canney
*Attorney, Agent, or Firm*—Francis J. Thornton

[57] ABSTRACT

The invention relates to a circuit arrangement for operating the read/write cycles of an integrated semiconductor memory storage system whose storage cells consist of flip flops with bipolar switching transistors, Schottky diodes as read/write elements coupling the cell to the bit lines, and high-resistivity resistors, or transistors controlled as current sources, as load elements, in several phases.

This is accomplished through coupling the storage cell to both read/write circuits and restore/recovery circuits via the bit lines and by selective pulsing of the cell with the read/write circuits and the restore/recovery circuits.

This permits high speed, low operating current, large scale memory systems to be built.

9 Claims, 5 Drawing Figures

CIRCUIT ARRANGEMENT FOR OPERATING A SEMICONDUCTOR MEMORY SYSTEM

BACKGROUND OF THE INVENTION

1. Field of the Invention

The invention relates generally to a semiconductor memory storage system and its method of operation.

More particularly the invention relates to a system in which both the read/write circutis and restore/recovery circuits are coupled to the storage cells via the bit lines and whose read/write cycles are performed in several phases.

2. Description of the Prior Art

Present memory systems and in particular those used for computer applications are manufactured using integrated semiconductor technology, and as such comprise a plurality of specifically organized memory storage cells formed in monolithic semiconductor chips.

Such storage cells have been designed using flip flop circuits having bipolar transistors as the switching transistors, Schottky diodes as the read/write elements coupling the cell to the bit lines and high-resistivity resistors as the load elements. Such a cell is shown, for example, in the IBM Technical Disclosure Bulletin, Vol. 16, No. 6, November 1973, on pages 1920 to 1921. This cell when used as described has the disadvantage that the cell node potentials are not sufficiently rapidly raised to values such that the cell can be affected by read/write operations of adjacent storage cells. As a result, a relatively long time has to elapse before the next read/write cycle can be initiated, thus a system using the described cell will have relatively long read/write cycles.

A monolithic storage cell with two base-collector cross-coupled transistors having a collector resistor, with a relatively high resistivity, and one diode per transistor connected parallel thereto, whereby the resistor is designed as a pinch resistor is also known. The design of the pinch resistor is such that the collector resistor belonging to the circuit of one transistor of the cell is designed as a resistor buried under the emitter material in the extension of the base zone of the other transistor, and the diode is connected parallel to the collector resistor of one transistor being formed by the base-collector junction of the other collector resistor. Although this described cell is highly integratable, it has the disadvantage that the cell node potentials are raised only slowly to values at which the cell is not affected by read/write operations of adjacent storage cells, so that the read/write cycle is very long. These pinch resistors have the further disadvantage of leading to a relatively high storage cell current and relatively high power dissipation, respectively, so that from the thermal standpoint, higher integration densities on the storage chip are limited.

In order to reduce the storage cell currents and thus the power dissipation, it would, in principle, be possible to use bipolar transistors instead of pinch resistors as load elements. Although from a thermal standpoint this would permit a higher integration density, the reduced storage cell current would delay still further the charging of the storage cell nodes after selection of a storage cell, thus substantially prolonging the read or write cycles.

SUMMARY OF THE INVENTION

Broadly speaking the present invention is directed towards a storage cell memory system and more particularly to a storage cell memory system in which each cell has its storage nodes charged after each selection so that the system has a high operating speed and a low operating current.

The present invention achieves these desirable results in a semiconductor storage system in which a read/write circuit and a restore/recovery circuit is coupled to the bit lines of each cell to which the read/write pulse is applied in several stages.

It is also an object of the invention to provide a method of, and a circuit arrangement for, operating an integrated semiconductor storage memory, whose storage cells consist of flip flops with bipolar switching transistors, Schottky diodes as elements coupling the cell to bit lines, and high-resistivity resistors, or transistors controlled as current sources, as load elements, in order to reduce the system cycle time and ensure low storage cell currents by a suitable arrangement of the peripheral circuits and by the read/write pulse sequence and the restore and recovery pulse sequence.

It is still a further object of the invention to describe a method of selecting, reading, writing and restoring the storage cells of the system that leads to a rapid and stable operation of the storage cells and which permits each storage cell to remain unaffected by read/write operations applied to adjacent storage cells.

DESCRIPTION OF THE DRAWINGS

These and other features of the present invention will be more fully appreciated and understood by considering the following description taken in conjunction with the accompanying drawing in which:

Referring to the drawings in more detail, FIGS. 1 to 4 show only a part of the storage matrix arranged on a semiconductor chip, namely, a bit line pair B0 and B1 with a storage cell coupled therebetween, and the associated recovery/restore and the read/write circuit.

The storage cell is a cross-coupled transistor flip flop with each of the bases of the two switching transistors TX1 and TX2, coupled to the collector of the other transistor, i.e., the nodes B and C, and to a respective one of the two bit lines B0 or B1 via respective Schottky diodes SX1 and SX2. These switching transistors TX1 and TX2 further have their collectors coupled through respective load transistors TX3 and TX4 and resistor R10 to ground, and their emitter connected to a common terminal A and to a word line WL. The switching transistors TX1 and TX2 may also be provided with clamping Schottky diodes 11 and 12. The bases of the load transistors are connected to a voltage source VN.

Figure 1:
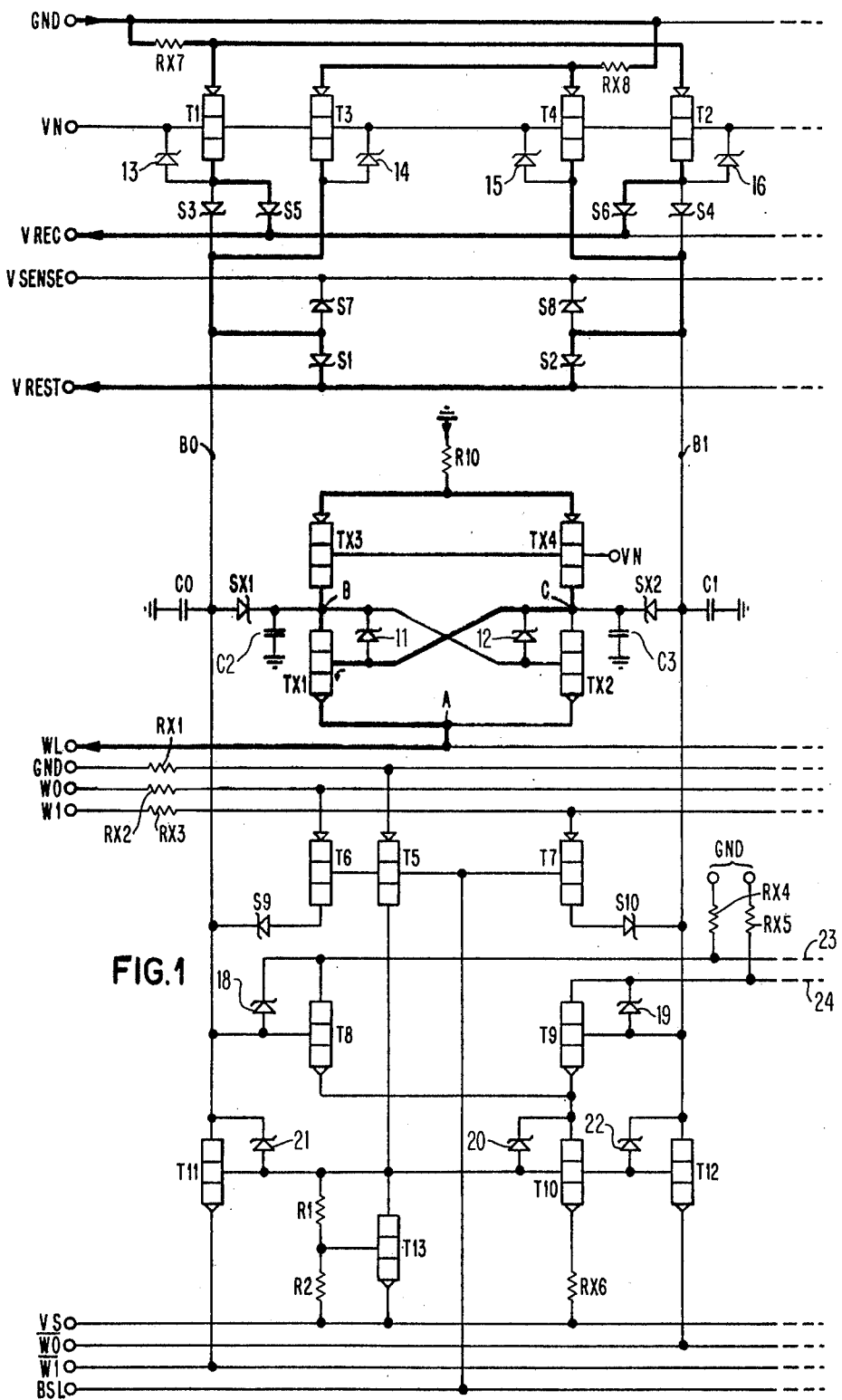
FIG. 1 is a circuit diagram of a storage cell with the various peripheral circuits, showing the currents in the standby phase.

Above this storage cell in FIG. 1 the recovery/restore circuit is arranged, whereas the read/write circuit is arranged below the storage cell. The circuit is thus subdivided into an upper part for the recovery/restore operations and a lower part for the read/write operations and makes for an optimal arrangement of the peripheral circuits in relation to the storage cell.

The upper part of the circuit, i.e., the recovery/restore circuit, consists of the resistors RX7 and RX8, the PNP transistors T1, T2, T3, and T4, as well as of the Schottky diodes S1, S2, S3, S4, S5, S6, S7, and S8. The resistors RX7 and RX8 are connected via one terminal point to the common ground line GND. The other terminal of resistor RX7 is connected both to the emitter of the PNP transistor T1 and the emitter of the PNP transistor T2. The other terminal of resistor RX8 is connected to the emitters of the PNP transistors T3 and T4. The bases of transistors T1 to T4 are all connected to a fixed potential VN of, for example, $-1.5V$. Between the collector and base of each of the PNP transistors T1 to T4, one respective clamping Schottky diode, 13, 14, 15, and 16, is arranged. The collector of transistor T1 is linked to bit line B0 via a Schottky diode S3 and via a further Schottky diode S5 to the recovery line VREC. Transistor T3 has its collector connected to bit line B0. As the circuit is symmetrically designed, PNP transistor T2 has its collector linked to bit line B1 via a Schottky diode S4 and to the recovery line VREC via a further Schottky diode S6, and PNP transistor T4 has its collector directly connected to bit line B1. Bit lines B0 and B1 are also coupled to a restore line VREST and to a fixed potential line VSENSE via Schottky diode pairs S1, S7 and S2, S8, respectively. Capacitors C0 and C1 shown on bit lines B0 and B1 respectively as well as the capacitors C2 and C3 at nodes B and C respectively on the storage cell are parasitic line and circuit capacities. The read/write circuit in the lower part of FIG. 1 consists of the PNP transistors T5, T6, and T7, the NPN transistors T8, T9, T10, T11, T12, and T13 their respective Schottky clamping diodes, 18, 19, 20, 21, and 22, the Schottky diodes S9 and S10 connected in series to the PNP transistors T6 and T7 respectively and coupled to the bit lines B0 and B1, and the resistors R1 and R2 as well as the resistors RX1 to RX6. A ground potential line GND is connected through line resistor RX1 to the emitter of transistor T5, a write control signal line W0 is connected through resistor RX2 to the emitter of transistor T6 and a write control signal line W1 is connected through resistor RX3 to the emitter of transistor T7. The lines 23 and 24 connected to the collectors of respective transistors T8 and T9 lead to a sense (read) amplifier (not shown) and are coupled to ground GND through resistors RX4 and RX5 respectively. Line VS carrying a fixed potential of $-4V$ is connected to the emitter of transistor T13 and to the base of transistor 13 through resistor R2 and to the emitter of transistor T10 through resistor RX6. The write control signal line $\overline{W0}$ is connected to the emitter of transistor T12. The write control signal line $\overline{W1}$ is connected to the emitter of transistor T11 and the bit selection signal line BSL is connected to the bases of transistors T5, T6, and T7.

The operation of the circuit is described below by means of FIGS. 1 to 5. Initially, the operation of the circuit in the standby phase is described by means of FIG. 1. During this standby phase the word line WL is at its standby potential of $-2.2$ volts. The PNP transistors T3 and T4 supply currents of 10 microampere each into the respective bit lines B0 and B1. The potential for the bit lines B0 and B1 is accurately defined and limited to a restore level of $-2.8$ volts by means of the Schottky diodes S1 and S2 coupling the bit line to the line VREST held at suitably negative voltage. The bit line potential and the word line potential are chosen so that no current flows via the coupling Schottky diodes SX1 and SX2 into the storage cell. The storage cell only carries the standby current which is discharged via the word line WL. The lower part of the circuit, i.e., the read/write circuit, is inoperative in this standby phase.

Figure 2:
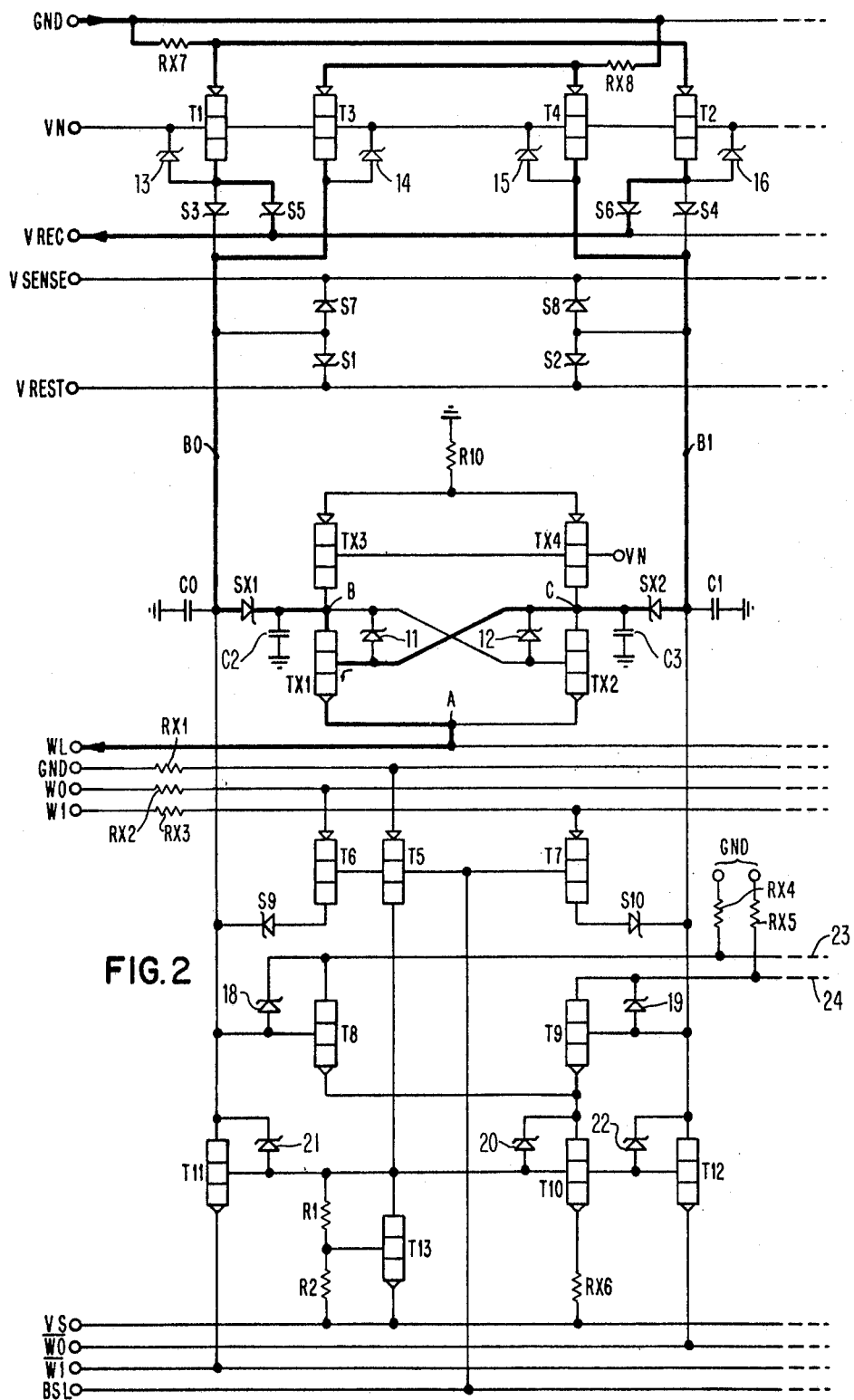
FIG. 2 is a circuit diagram as in FIG. 1, showing the currents during the read phase.
Figure 5:
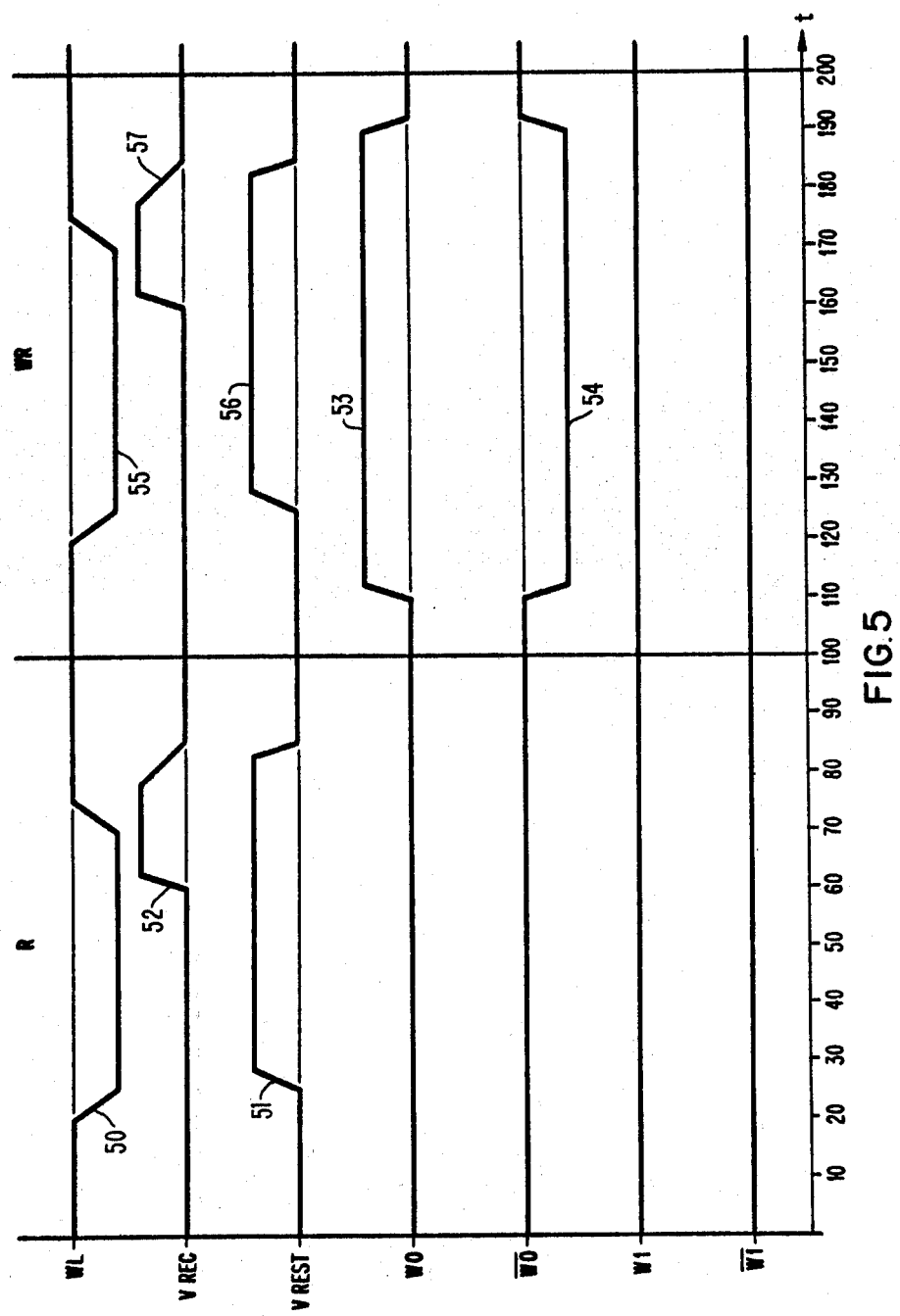
FIG. 5 is a time diagram showing in particular the signals and potentials for selection, the recovery phase, the restore phase, the write phase, and the read phase.

The read cycle is subdivided into a read phase, a recovery phase, and a restore phase, and will be described below with particular reference to FIGS. 2 and 5 and especially the left side of FIG. 5 designated as R. Initially as may be seen from FIG. 5, the storage cell is selected by lowering the word line WL to about 3.2 volts by a negative pulse 50. When pulse 50 reaches its full value the line VREST is pulsed to a higher level as indicated by pulse 51 turning off Schottky diodes S1 and S2 and causing the currents from transistors T3 and T4 to flow into the bit lines. For the present example it is assumed that the left transistor TX1 of the storage cell is on or conductive and the right transistor off or nonconductive. Because transistor TX1 of the storage cell is conductive, it, under these voltage conditions, pulls the voltage on the bit line B0 down to a lower level. At the same time the voltage level of the other bit line B1 rises slightly by means of the bit line current. This causes a voltage differential across the cell which is amplified by the selected differential amplifier consisting of the transistors T8 and T9. This differential amplifier is simultaneously selected via the PNP transistor T5 whose base is pulled down to $-1.5$ volts by the application of suitable voltage pulse to bit selection line BSL and which thus determines the differential amplifier current via transistor T10. Transistor T8 and T9 are thus a current switch. The current in transistor T10 is a function of resistor RX6 on its emitter and of the potential on the base which is determined by transistor T13 whose emitter is connected to the fixed potential VS of $-4.2$ volts and whose base is biased via the voltage divider R1 and R2. Transistors T6, T7, T11, and T12 are not active during the read cycle.

A higher restore level, can, in principle, be applied to the VREST line but would increase the capacitive current. In large-scale systems this would necessitate unduly broad word lines. The respective bit line B1 or B0 is very rapidly discharged via the conductive switching transistor, such as TX1, since these receive a high capacitive base current during the switching phase. This leads to the difference signal being built up between the two bit lines B1 and B0 within a very short time.

After completion of the read operation, the storage cell is deselected by switching off diodes S5 and S6. This switching off of diodes S5 and S6 is accomplished by applying a positive pulse 52 to line VREC and by increasing the potential on word line WL to its normal level. When diodes S5 and S6 switch off the currents from transistors T1 and T2, normally flowing through diodes S5 and S6 to recovery line VREC, are now forced through diodes S3 and S4 respectively to bit lines B0 and B1 respectively. These currents are in addition to the currents through transistors T3 and T4 and causes the capacitors C2 and C3 at storage cell nodes B and C to be charged to a potential whose magnitude is equivalent to the standby potential minus the voltage across a Schottky diode. This total current shown in FIG. 4 as IREC0 and IREC1 in bit lines B0 and B1, charges the storage cell nodes B and C previously described as well as capacitors C0 and C1 until one of the bit lines B0 or B1 has reached the potential applied to line VSENSE via Schottky diodes S7 and S8, respectively. In the described case this occurs when bit line B1 reaches the potential of line VSENSE through diode S7. This prevents the state of the cell from being disturbed by this charging of the capacitors. The signal thus occurring on the line VSENSE is now used to shut off pulse 52 bringing down line VREC to cause Schottky diodes S5 and S6 to switch on and divert currents supplied by current sources T1 and T2 from the bit lines B0 and B1 to the line VREC. Thus the recovery phase is terminated.

Figure 4:
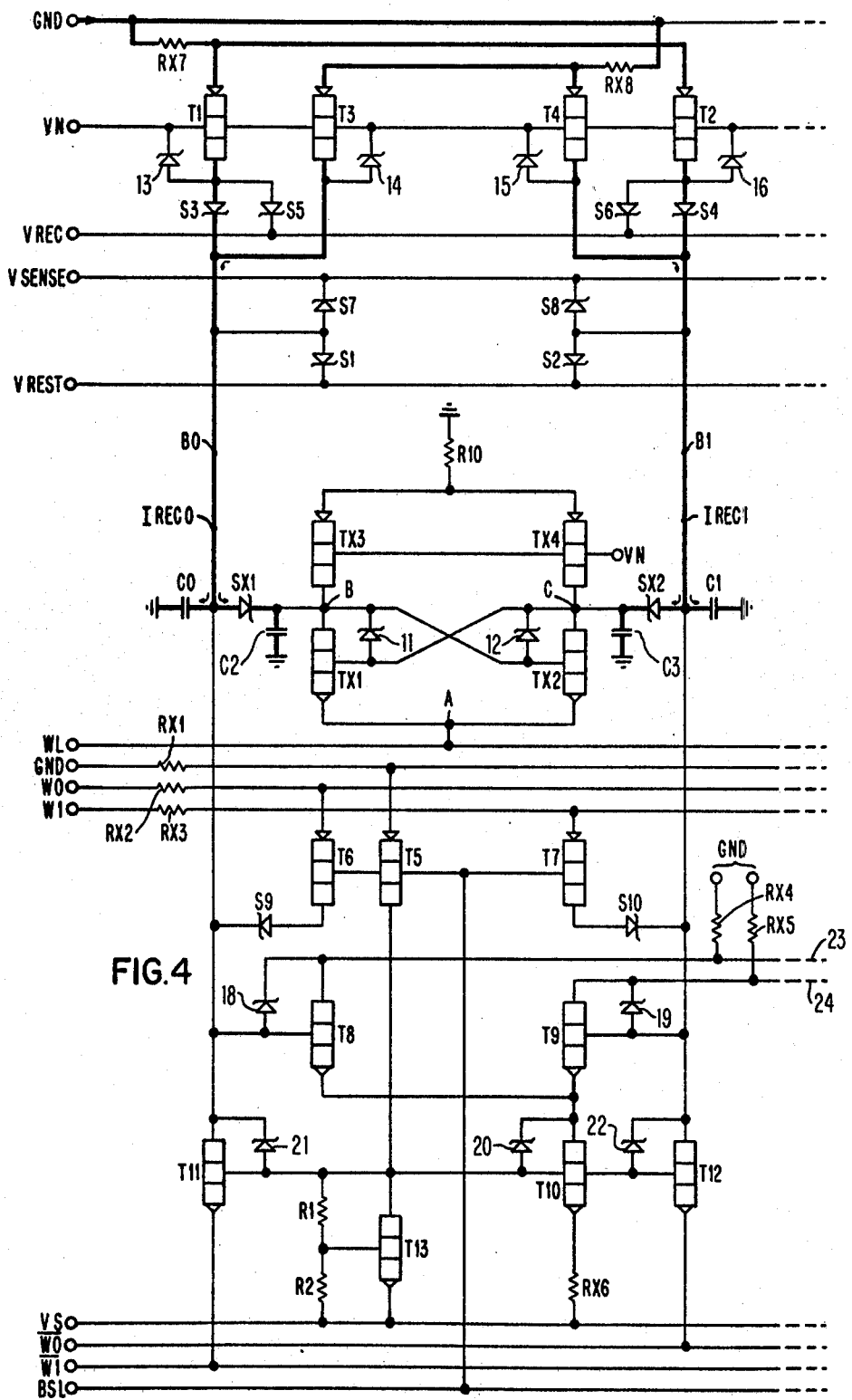
FIG. 4 is a circuit diagram as in FIG. 1, showing the currents during the recovery phase and by means of which the restore phase is described.

This is followed by a restore phase (FIG. 4). After the recovery phase bit lines B0 and B1 still have different potentials. By setting the voltage on line VREST bit lines B0 and B1 are discharged via Schottky diodes S1 and S2 and forced to a common standby potential. This restores the original state of bit lines B0 and B1 and of the storage cell. After this restore phase a full write cycle will be performed.

Figure 3:
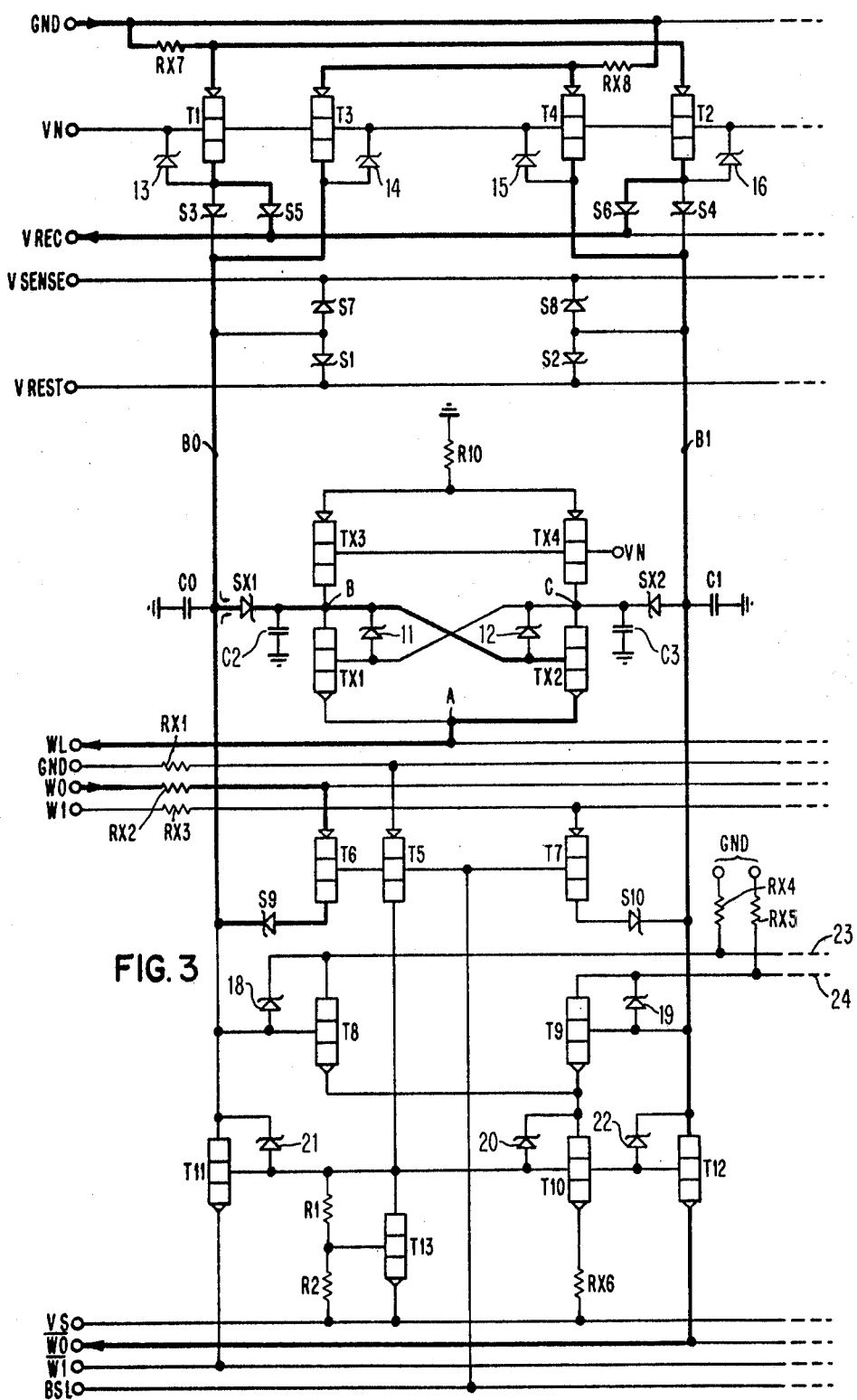
FIG. 3 is a circuit diagram as in FIG. 1, showing the currents during the write phase.

For purposes of illustration, it will be assumed that the restore phase described above is followed by a full write cycle described below with reference to FIG. 3 and the pulse on the right side of FIG. 5. The write cycle is subdivided into a write phase, a recovery phase, and a restore phase.

For purposes of illustration only, it will be assumed that the cell is to be written so that switching transistor TX2 becomes conductive and switching transistor TX1 is rendered nonconductive. To so write the cell a positive pulse 53 is applied to signal line W0 and its complementry negative pulse 54 is applied to signal line $\overline{W0}$. When the bit selection signal now is applied to the bit selection line BSL and thus to the bases of transistors T5, T6, and T7, transistor T6 and transistor T12 both become conductive with transistor T12 receiving its base current via transistor T5. Transistor T7 and T11 remain off because signal lines W1 and $\overline{W1}$ remain at their quiescent voltages and are not pulsed.

The word line WL is now pulled down as shown by pulse 55 for selection of the cell. Because transistor T12 is conductive any current flowing into bit line B1 is diverted from the cell to line $\overline{W0}$ and line B1 is held low. Simultaneously because transistor T6 is conductive is supplies a current into bit line B0 which exceeds the standby current of the storage cell by at least the current amplification factor $\beta$ of the transistor driving line B0 up. These current flows force switching transistor TX2 to become conductive and switching transistor TX1 to become nonconductive thus rewriting the state of the cell.

This write cycle also includes a recovery and a restore phase similar to those described with the read cycle. Thus once the pulse 55 reaches its full value a positive pulse 56 is applied to the line VREST. To assure that the current from transistors T3 and T4 is caused to flow into the respective bit lines B0 and B1. Subsequently a pulse 57 is applied to the VREC line causing the additional current from transistors T1 and T2 to flow into the respective bit lines B0 and B1 and recharge the capacitors as taught above.

This described circuit and its operation has the following advantages:

The selection of the word lines lead to a rapid and stable operation of the storage cells. During the selection phase, a storage cell is written or read by externally controlling the bit line currents. In the recovery phase the increased bit line currents occurring are used to raise the cell node potentials to values at which a storage cell is not affected by read/write operations of adjacent storage cells. During selection, the level of the bit lines has to be changed only slightly, since after the recovery potential has been reached in the restore phase the bit lines are forced to a uniformly low restore potential. During writing, a high write current is fed via a bit line from a controlled current source to the storage cell to be written into. At the same time, a push-pull circuit forces the potential of the other bit line downwards, carrying only the low restore current. For reading the differential amplifier is switched on for selection via a controlled current source. During this time, the write part is not activated. As the storage cell is recharged by the external currents in the recovery phase, the operating speed, i.e., the total cycle time of the semiconductor storage, occurs at very low standby currents in the storage cell. As a result of this, the proposed operational mode and the circuit used to perform it permit building large-scale storage systems with highly integrated low operating current high speed storage cells. Also the integrated design of the circuit requires only very little space, since the circuits for reading and writing are incorporated in the overall circuit.

While the invention has been particularly shown and described with reference to the preferred embodiment thereof, it will be understood by those skilled in the art that numerous changes in form and detail of the circuit may be made therein without departing from the spirit and scope of the invention.

What is claimed is:

1. A memory circuit comprising:
    a word line,
    a pair of bit lines,
    a cross coupled bipolar memory cell coupled between the bit lines and having its collector emitter circuits coupled to the word line,
    means coupled to the word line for selectively setting the word line at first and second voltage levels, said second voltage level being at a magnitude lower than said first voltage level,
    a pair of current sources each being coupled between ground and a current sink through a first diode and a respective one of said bit lines through a second diode,
    means for selectively decoupling said current sources from said current sink during the application of said second voltage level to said word line and selectively coupling said current sources to said bit lines to switch the current flowing through said current sources to said bit lines to raise the voltage on said bit lines to a first selected voltage level, and
    means for maintaining a second selected voltage level on each of said bit lines.

2. The circuit of claim 1 wherein said means for maintaining said second selected voltage on each of said bit lines comprises a second current sink coupled to said bit lines and a second pair of current sources each of which is connected to a respective one of said bit lines.

3. The circuit of claim 2 wherein said means for maintaining said second selected voltage on each of said bit lines further includes means for sensing said selected level on one of said bit lines.

4. The circuit of claim 3 wherein each of said pair of current sources comprises a bipolar transistor coupled to said respective one of said bit lines through a diode and to said current sink source through a diode.

5. The circuit of claim 4 wherein said first selected level on said bit lines is at a magnitude higher than said second selected level.

6. The circuit of claim 5 wherein said second current sink is coupled to said bit lines through a Schottky barrier diode.

7. The memory circuit of claim 6 wherein there is further provided a differential sense amplifier coupled to said bit lines for sensing the state of the cell during a read cycle.

8. The memory circuit of claim 7 wherein there is further provided write circuit means coupled to said bit lines for setting the state of the cell into a selected state.

9. The memory circuit of claim 8 wherein said storage cell comprises cross coupled bipolar switching transistors having high impedance transistor load elements and are coupled to said word line through Schottky barrier diodes.

* * * * *